(12) United States Patent
Shino et al.

(10) Patent No.: US 6,870,438 B1
(45) Date of Patent: Mar. 22, 2005

(54) MULTI-LAYERED WIRING BOARD FOR SLOT COUPLING A TRANSMISSION LINE TO A WAVEGUIDE

(75) Inventors: Naoyuki Shino, Kokubu (JP); Shinichi Koriyama, Kokubu (JP); Kenji Kitazawa, Kokubu (JP); Hidehiro Minamiue, Kokubu (JP)

(73) Assignee: Kyocera Corporation, Kyoto (JP)

( * ) Notice: Subject to any disclaimer, the term of this patent is extended or adjusted under 35 U.S.C. 154(b) by 304 days.

(21) Appl. No.: 09/709,098

(22) Filed: Nov. 10, 2000

(30) Foreign Application Priority Data

| Nov. 10, 1999 | (JP) | 11-319974 |
| Mar. 28, 2000 | (JP) | 2000-089598 |
| Mar. 29, 2000 | (JP) | 2000-092191 |
| Jun. 28, 2000 | (JP) | 2000-194398 |
| Jun. 29, 2000 | (JP) | 2000-197262 |

(51) Int. Cl.[7] ............................................. H01P 5/107
(52) U.S. Cl. ........................................ 333/26; 333/247
(58) Field of Search ............................ 333/26, 33, 246, 333/247

(56) References Cited

U.S. PATENT DOCUMENTS

| 5,396,202 A | * | 3/1995 | Scheck | 333/26 X |
| 5,539,361 A | * | 7/1996 | Davidovitz | 333/26 |
| 5,793,263 A | * | 8/1998 | Pozar | 333/26 |
| 6,239,669 B1 | * | 5/2001 | Koriyama et al. | 333/26 |

* cited by examiner

*Primary Examiner*—Benny Lee
(74) *Attorney, Agent, or Firm*—Hogan & Hartson LLP

(57) ABSTRACT

A wiring board includes a dielectric substrate, a signal transmission line formed on one surface of the dielectric substrate, a grounded layer formed on the other surface of the dielectric substrate, and a connection portion for connecting portion for connecting the signal transmission line to a waveguide, the connection portion being formed on the grounded layer. The grounded layer has a slot at a position opposed to an end of the signal transmission line. The connection portion includes a first dielectric portion disposed to cover the slot of the ground layer, a second dielectric portion laminated on the first dielectric portion, and a patch conductor provided at a position opposed to said slot on an interface between the first dielectric portion and the second dielectric portion. The wiring board enables the signals to be efficiently transmitted from the signal transmission line to the waveguide with a small loss and a small reflection.

8 Claims, 7 Drawing Sheets

MULTI-LAYERED WIRING BOARD FOR SLOT COUPLING A TRANSMISSION LINE TO A WAVEGUIDE

BACKGROUND OF THE INVENTION

1. Field of the Invention

The present invention relates to a wiring board used for a high-frequency package for holding high-frequency devices such as semiconductor devices and passive devices that operate in high-frequency regions, used for a circuit substrate mounting such a package, or used for a circuit substrate directly mounting various devices on the surface thereof. More specifically, the invention relates to a wiring board used being connected to a waveguide to efficiently transmit signals between a signal transmission line and the waveguide.

2. Description of the Prior Art

The trend toward sophisticated information technology in modern society is accompanied by the development in the field of wireless and personalized data transmission as represented by cellular phones. In such circumstances, semiconductor devices have been developed that operate in millimeter wave (30 to 300 GHz) regions to enable the transmission of data at higher speeds and in larger quantities. Following the progress in such a modern technology related to high-frequency semiconductor devices, a variety of applied systems have also been proposed using electromagnetic millimeter waves, such as a radar between cars, wireless LAN, etc. There have been proposed, for example, a radar using millimeter waves (see Electronics Society Convention, Japanese Electronic Data Communication Academy, SC-7-6, 1995), a cordless camera system (see Electronics Society Convention, Japanese Electronic Data Communication Academy, C-137, 1995), and high-speed wireless LAN (see Electronics Society Convention, Japanese Electronic Data Communication Academy, C-139, 1995).

The progress of the application of millimeter waves is also accompanied by the development of devices for realizing the applied use thereof. In particular, it is a serious problem concerned to every kind of electronic component how to decrease the size and cost yet maintaining required transmission characteristics.

In such devices, one serious problem is how to simply connect the circuit substrate or the package holding the high-frequency device to an external electric circuit using a small structure. For example, one significant problem is how to connect the external electric circuit forming a waveguide having the smallest transmission loss to the circuit substrate or the package mounting the high-frequency device.

The high-frequency package has heretofore been connected to the waveguide formed in the external electric circuit by, for example, a method by which a signal transmission line formed in a high-frequency package is first converted into a coaxial line by using a connector and then connected to a waveguide, a method by which the waveguide is first connected to a microstrip line in the external electric circuit, and the microstrip line is connected to a signal transmission line formed in the high-frequency package, and by the like method.

Recently, furthermore, there has also been proposed a method by which the high-frequency package is directly connected to the waveguide of the external electric circuit (see Electronics Society Convention, Japanese Electronic Data Communication Academy, SC-7-5, 1995). According to this proposal, quartz is buried in a portion of a closure member forming a cavity in which the device is air-tightly sealed, and the electromagnetic waves from the waveguide are introduced into the cavity through the portion where the quartz is buried, in order to connect the waveguide to a waveguide-microstrip line converter substrate installed in the cavity.

According to the method by which the waveguide of the external electric circuit is connected to the package through another transmission line such as a connector or a microstrip line as described above, however, the connection structure itself becomes complex, and it becomes necessary to maintain a region for forming the connector or the transmission line, causing a problem in that the connection structure itself becomes bulky. Besides, the transmission loss may increase through the line or the connector.

On the other hand, the method which directly introduces the electromagnetic waves from the waveguide into the interior of the cavity of the package is effective in decreasing the size of the connection structure, but requires the use of a material having a small dielectric constant and a small dielectric loss tangent in order to decrease the loss of electromagnetic waves that pass through the cavity-forming member such as the closure and, hence, requires burying a material having a small dielectric constant and a small loss, such as quartz as taught in the above-mentioned literature. However, such burying not only spoils the reliability of the air-tight sealing but also is not quite suited for the mass production. It can also be considered to use a material having a small dielectric constant and a small loss as a material for forming the cavity. However, the material that constitutes the package requires various characteristics such as mechanical strength, air-tight sealing, metalizing property and like properties in addition to the electric properties. At present, however, no such a material is found that satisfies all of such properties and that can be cheaply produced.

Japanese Unexamined Patent Publication (Kokai) No. 112209/1999 and WO96/27913 propose technologies which are capable of air-tightly sealing the device and are capable of connecting signals between the transmission line and the waveguide. According to these technologies, the signals of the microstrip line are connected to the waveguide through an opening formed in the grounded layer and through the dielectric layer, and the waveguide is joined by adjusting the thickness of the dielectric layer under the opening to meet the frequency of the transmission signals and by using the dielectric layer to work as a resonator. Therefore, the thickness of the dielectric layer seriously affects and, accordingly, characteristics vary to a large extent.

Other structures for connecting the transmission line to the waveguide have also been disclosed in DE 4,208,058 and in U.S. Pat. No. 5,793,263, according to which the signal of a microstrip line are connected to the waveguide through an opening formed in the grounded layer and through a dipole antenna formed on the surface of a dielectric. According to these constructions, the waveguide is coupled by adjusting the length of the dipole antenna to meet the transmission frequency. Being affected by the thickness of the dielectric layer under the opening and by the length of the dipole antenna, therefore, it is difficult to strictly control the length of the antenna at the time of manufacturing and, hence, characteristics vary to a larger extent.

SUMMARY OF THE INVENTION

It is therefore an object of the present invention to provide a wiring board capable of connecting a signal transmission line formed on the surface of a wiring board such as a high-frequency package to a waveguide causing a small loss of signals or a small reflection.

According to the present invention, there is provided a wiring board comprising a dielectric substrate, a signal transmission line formed on one surface of the dielectric substrate, a grounded layer formed on the other surface of the dielectric substrate, and a connection portion for connecting the signal transmission line to a waveguide, the connection portion being formed on the grounded layer; wherein, the grounded layer has a slot at a position opposed to an end of the signal transmission line; and the connection portion includes a first dielectric portion formed so as to cover the slot of the ground layer, a second dielectric portion laminated on the first dielectric portion, and a patch conductor provided at a position opposed to said slot on an interface between the first dielectric portion and the second dielectric portion.

That is, according to the present invention, the signal transmission line formed on the surface of the dielectric substrate is electromagnetically coupled to the slot in the grounded layer formed on the other surface (back surface) of the dielectric substrate. On the slot is provided the waveguide connection portion which comprises a laminate of the first dielectric portion and the second dielectric portion and which has the patch conductor on the interface between the first dielectric portion and the second dielectric portion. It is thus made possible to efficiently transmit the signals between the signal transmission line and the waveguide causing a small loss and a small reflection, as well as to air-tightly seal the high-frequency devices maintaining reliability.

In the present invention, a dielectric block (first dielectric block) forming the first dielectric portion and a dielectric block (second dielectric block) forming the second dielectric portion may be laminated with the patch conductor sandwiched therebetween to form the waveguide connection portion (hereinafter often referred to as a block-type connection portion) in only a portion where the slot is formed. Alternatively, the first dielectric layer and the second dielectric layer may be laminated so as to cover substantially the whole surface of the grounded layer having the slot and the patch conductor may be provided in only a portion opposed to the slot in the interface between the two layers thereby to form the waveguide connection portion (hereinafter often referred to as layer-type connection portion).

In the wiring board on which the block-type connection portion is formed, a flange at the end of the waveguide is secured to the grounded layer so as to surround the slot, and the block-type connection portion enters into tubular space in the waveguide.

In the layer-type connection portion, vertical conductors penetrate through the first dielectric layer and the second dielectric layer so as to surround the slot and the patch conductor opposed to the slot. That is, a region surrounded by the vertical conductors in the first dielectric layer serves as the first dielectric portion, and a region surrounded by the vertical conductors in the second dielectric layer serves as the second dielectric portion. In this case, the waveguide is connected to the wiring board by securing the flange thereof to the second dielectric layer. In the wiring board having the layer-type connection portion, it is desired that the flange of the waveguide is electrically connected to the grounded layer on the back surface of the dielectric substrate through the vertical conductors in order to suppress the leakage of electromagnetic waves from the laminated connection portion and to decrease the transmission loss.

The wiring board having the layer-type connection portion permits the dielectric substrate and the waveguide connection portion to be fabricated integrally together, which is well suited for mass production. Further, the waveguide can be attached to the layer-type connection portion (second dielectric layer) by a screw, effectively avoiding the breakage in the dielectric substrate caused by the fastening with a screw, and making it possible to easily attach and detach the waveguide. The wiring board is inspected for its transmission characteristics by connecting the waveguide thereto. The waveguide is then removed and, then, the wiring board is shipped as a product. In conducting the inspection, the waveguide can be easily attached and detached to quickly inspect the wiring board.

In the wiring board of the present invention having the above-mentioned block-type connection portion or the layer-type connection portion, it is desired that the length SL of the slot formed in the grounded layer on the back surface of the dielectric substrate in a direction at right angles with the signal transmission line is one to two times as great as the wave length $\lambda$ of the signals that propagate through the dielectric substrate. It is further desired that when the patch conductor has a rectangular shape, a maximum length of the patch conductor is denoted by W1 in a direction at right angles with the signal transmission line, and a maximum length is denoted by L1 in a direction in parallel therewith, there holds a relationship $L1 \geq W1$. It is further desired that the length L1 satisfies the condition of the following formula, $$10\lambda/64 \leq L1 \leq 31\lambda/64$$

or $$33\lambda/64 \leq L1 \leq 63\lambda/64$$

wherein $\lambda$ is a wave length of signals propagating through the dielectric substrate.

DETAILED DESCRIPTION OF THE INVENTION

The invention will now be described in detail by way of embodiments shown in the accompanying drawings.

Figure 1A:
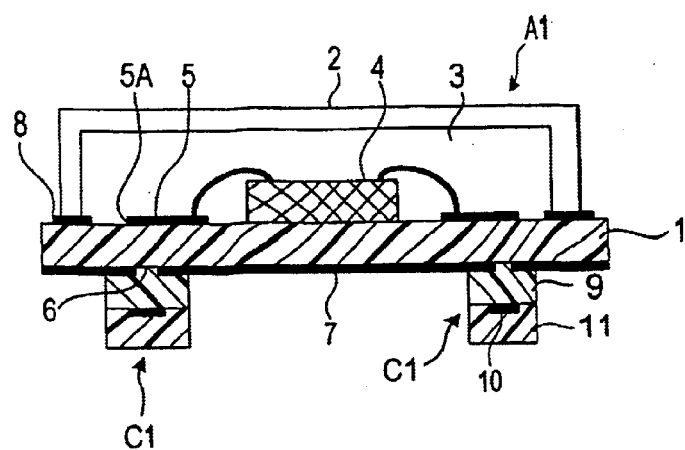
FIG. 1a is a side sectional view of a wiring board of the present invention equipped with a block-type waveguide connection portion.

Referring to FIG. 1a illustrating a wiring board (high-frequency package) of the present invention equipped with a block-type waveguide connection portion, the high-frequency package A1 has a dielectric substrate 1 mounting a high-frequency device 4 on the surface thereof. The high-frequency device 4 is air-tightly sealed in a cavity 3 formed in a closure member 2 mounted on the surface of the dielectric substrate 1 via a conductor layer 8.

A signal transmission line 5 is formed on the surface of the dielectric substrate 1 in the cavity 3, the signal transmission line 5 being connected at its one end to the high-frequency device 4 and having an end 5a. A grounded layer 7 is formed on the whole back surface of the dielectric substrate 1, and an elongated hole (so-called slot) 6 without conductor is formed in the grounded layer 7 at a position opposed to the end 5a of the signal transmission line 5.

In the package A1, a micro strip line (signal transmission line 5 is a center conductor) is formed by the signal transmission line 5 and by the grounded layer 7. On the surface of the dielectric substrate 1, grounded layers may be formed on both sides of the signal transmission line 5, and a grounded coplanar line may be formed by these grounded layers and the signal transmission line 5, the signal transmission line 5 serving as a center conductor.

Figure 3:
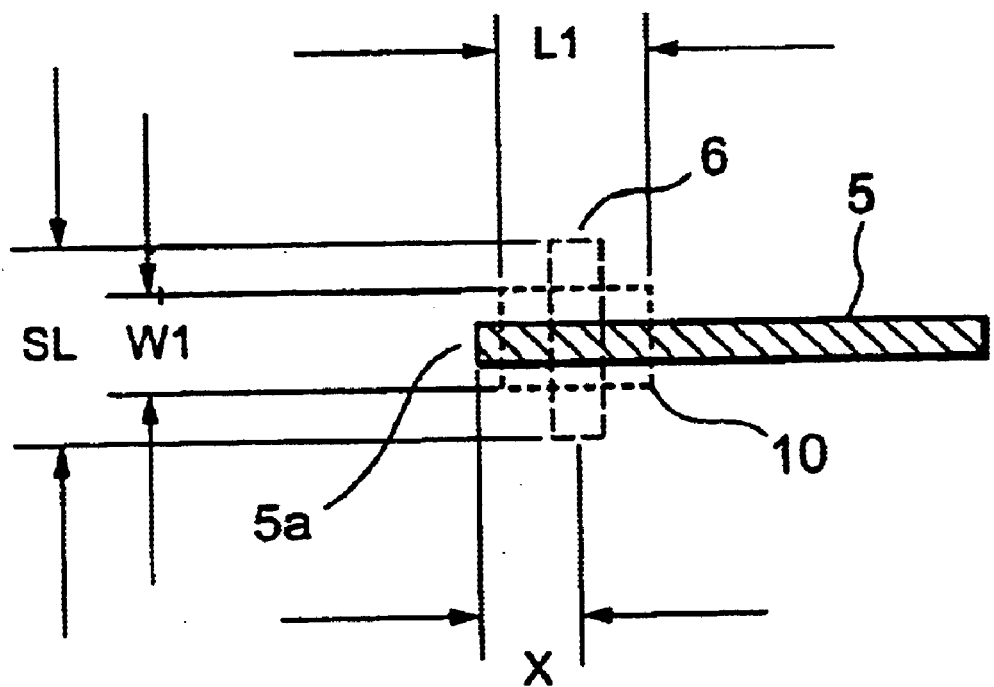
FIG. 3 is a view illustrating a positional relationship among the signal transmission line in the wiring board of FIGS. 1a and 2a, a slot and a patch conductor.

In the above line construction, the signal transmission line 5 of the microstrip line is electromagnetically coupled to the slot 6. That is, the electric power is fed to the slot hole 6 through electromagnetic coupling. This electromagnetic coupling structure has been known in the prior art. Referring, for example, to FIG. 3, the electromagnetic coupling is accomplished by selecting the length x by which the end 5a of the signal transmission line 5 of the microstrip line protrudes beyond the center of the slot 6, to be one-fourth the wave length λ of the signals that propagate through the dielectric substrate 1 (a favorable electromagnetic coupling is accomplished not only being limited to the above dimensional relationship but also relying upon other dimensional relationships, as a matter of course).

In the high-frequency package A1 of the present invention shown in FIG. 1a, a block-type waveguide connection portion C1 is provided on a portion where the slot 6 is formed in the grounded layer 7. The block-type waveguide connection portion C1 is constituted by a first dielectric block 9 (corresponds to a first dielectric portion) laminated on the grounded layer 7 so as to completely cover the slot 6, a second dielectric block 11 (corresponds to a second dielectric portion) laminated on the first dielectric block 9, and a patch conductor 10 formed in the interface between the two blocks 9 and 11 in a portion opposed to the slot 6.

Figure 1B:
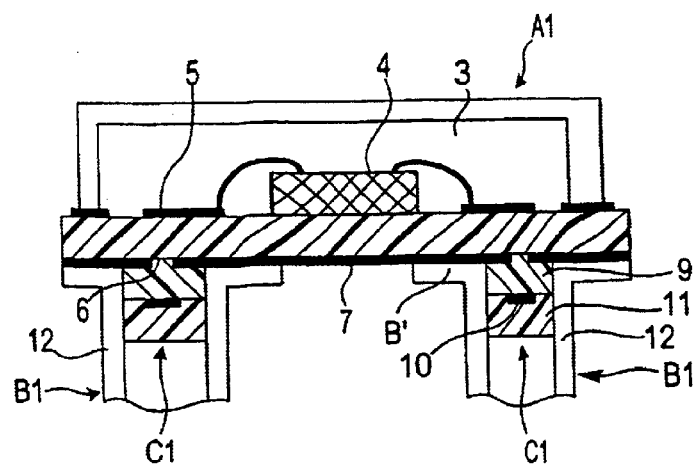
FIG. 1b is a side sectional view schematically illustrating a structure for connecting the wiring board of FIG. 1a to a waveguide.

FIG. 1b is a side sectional view schematically illustrating the structure for connecting the high-frequency package A1 of FIG. 1a to a waveguide B1. As will be obvious from FIG. 1b, the block-type waveguide connection portion C1 of the high-frequency package A1 has a size equal to, or smaller than, the opening of the waveguide B1. That is, a flange B' of the waveguide B1 is secured to the grounded layer 7 in a manner that the slot 6 is at the center of the waveguide B1 and, in this state, the block-type waveguide connection portion C1 is disposed in the waveguide B1.

In this connection structure, the flange B' of the waveguide B1 is secured to the grounded layer 7 by brazing or by using a screw, and a conductor wall 12 of the waveguide B1 is electrically connected to the grounded layer 7, so that the grounded layer 7 and the waveguide B1 share the same potential. In FIG. 1b, the outer peripheries of the block-type waveguide connection portion C1, i.e., the outer peripheries of the first dielectric block 9 and of the second dielectric block 11, are contacted to the inner walls of the waveguide B1. However, a gap may be formed between the outer peripheries and the inner walls of the waveguide B1.

In the wiring board (high-frequency package A1) of the present invention to which the waveguide B1 is connected as shown in FIG. 1b, the signals of the signal transmission line 5 connected to the high-frequency device 4 in the cavity 3 are electromagnetically couple to the slot 6 formed in the grounded layer 7, rendered to be continuous and smooth for their electromagnetic field of signals, which propagate from the slot 6 to the waveguide B1, due to the patch conductor 10, and are transmitted to the waveguide B1 passing through the second dielectric block (second dielectric portion) 11. The patch conductor works to separate the electromagnetic waves into both sides thereof, instead of concentrating the electric current which is done by the antennas disclosed in DE 4,208,058 and U.S Pat. No 5,793,263.

According to this construction, the patch conductor 10 suppresses the upward radiation of the electromagnetic waves from the signal transmission line 5, and works to confine the electromagnetic waves within the first dielectric block 9 and the second dielectric block 11. As a result, there is realized a connection structure permitting a small transmission loss of high-frequency signals. Therefore, unlike the patch antenna (with which the transmission characteristics change greatly depending upon the length), the patch conductor 10 does not cause the transmission characteristics to change despite that its length is varied. Therefore, the patch conductor 10 makes it easy to maintain dimensional precision and to decrease dispersion in the transmission characteristics.

In the high-frequency package A1 shown in FIG. 1a, after the dielectric substrate 1 equipped with the signal transmission line 5 and the grounded layer 7, is formed, the first dielectric block 9 and the second dielectric block 11 can be mounted on the surface of the grounded layer 7 with a suitable adhesive accompanied, however, by an increase in the number of the production steps. In order to decrease the number of the production steps, therefore, the high-frequency package A1 may be fabricated by using ceramics as a dielectric material for forming the dielectric substrate 1, printing the grounded layer 7 and the signal transmission line 5 onto a ceramic green sheet (corresponds to the dielectric substrate 1) that has not been fired yet, adhering the dielectric blocks 9 and 11 made of unfired ceramics thereto using an adhesive, and co-firing them at one time.

In the above-mentioned wiring board (high-frequency package A1) shown in FIGS. 1a and 1b, the block-like waveguide connection portion C1 is formed on only a portion where the slot 6 is formed in the grounded layer 7. According to the present invention, however, the waveguide connection portion can be formed by providing a laminate of dielectric layers on the whole surface of the grounded layer 7. A wiring board (high-frequency package) equipped with the above layer-like waveguide connection portion is shown in FIGS. 2a, 2b, 2c and 2d. With respect to all Figures herein, like reference labels in different drawing figures refer to the same feature.

Figure 2A:
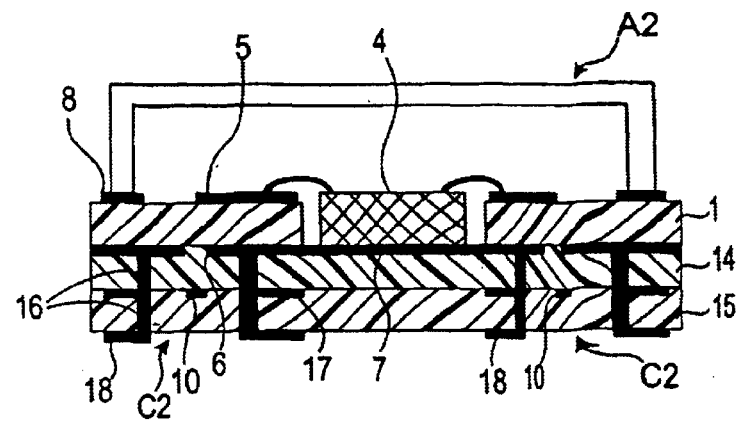
FIG. 2a is a side sectional view of the wiring board of the present invention equipped with a layer-type waveguide connection portion.

Referring to FIG. 2a which is a side sectional view schematically illustrating the high-frequency package equipped with the layer-type waveguide connection portion, the basic structure of the dielectric substrate 1 of the high-frequency package A2 is the same as that of the high-frequency package A1 shown in FIG. 1a. That is, a cavity is formed in the dielectric substrate 1, and the high-frequency device is mounted on the grounded layer 7 in the cavity. Like the package A1 of FIG. 1a, the signal transmission line 5 is formed on the surface of the dielectric substrate 1, the grounded layer 7 is formed on the back surface of the dielectric substrate 1, and the slot 6 is formed in the grounded layer 7 so as to be opposed to an end of the signal transmission line 5. Their structures are as described concerning the high-frequency package A1 shown in FIG. 1a.

In the high-frequency package A2 of FIG. 2a, the first dielectric layer 14 and the second dielectric layer 15 are laminated on the whole surface of the grounded layer 7 formed on the bottom surface of the dielectric substrate 1. The above-mentioned patch conductor 10 is provided in the interface between the first dielectric layer 14 and the second dielectric layer 5 so as to be opposed to the slot 6 in the grounded layer 7. As will be obvious from the bottom view of FIG. 2b, further, plural vertical conductors 16 are arranged penetrating through the first dielectric layer 14 and the second dielectric layer 15 so as to surround the patch conductor 10 and the slot 6 with the patch conductor 10 as a center. The vertical conductors 16 are electrically connected to the grounded layer 7, the region surrounded by the vertical conductors 16 serves as the waveguide connection portion C2, the region of the first dielectric layer 14 surrounded by the vertical conductors 16 corresponds to the first dielectric portion, and the region of the second dielectric layer 15 surrounded by the vertical conductors 16 corresponds to the second dielectric portion as shown in FIG. 2A.

It is desired that the gap among the vertical conductors 16 is set to be one-fourth the wavelength λ of the signals to prevent the leakage of electromagnetic waves from the waveguide connection portion C2 to the external side. In order to more reliably prevent the leakage of the electromagnetic waves, further, it is desired to provide a conductor layer 17 in the interface between the first dielectric layer 14 and the second dielectric layer 15s outside the vertical conductors 16 as shown in FIG. 2A.

On the surface of the second dielectric layer 15 is further formed an electrically conducting layer 18 that is electrically connected to the vertical conductors 16. As shown in FIG. 2c, the flange B' of the waveguide B1 is mounted on the electrically conducting layer 18 by junction means using an electrically conducting adhesive such as a brazing material or by mechanical junction means such as fastening using a screw. The waveguide B1 and the grounded layer 7 share the same potential.

The high-frequency package A2 of the structure shown in FIG. 2a is more advantageous than the high-frequency package A1 shown in FIG. 1a in regard to that the waveguide B1 is connected to the waveguide connection portion C2 by mechanical means such as using a screw without at all giving damage to the dielectric substrate 1. The whole thickness and the strength of the package A2 are larger than that of the package A1. Therefore, the package A2 enables the waveguide to be connected more reliably than the package A1. The high-frequency package A2 is further superior to the high-frequency package A1 even from the standpoint of productivity. That is, the high-frequency package A2 can be produced by firing the dielectric substrate 1, first dielectric layer 14, second dielectric layer 15, semiconductor layers 17, 18 and vertical conductors 16 at one time relying upon the known ceramic lamination technology. When the high-frequency package A1 is produced by being fired at one time, however, it is likely that the unfired ceramic block which constitutes the waveguide connection portion peels in a stage of before being fired. In the case of the high-frequency package A2, however, the waveguide connection portion is formed of the first dielectric layer 14 and the second dielectric layer and, hence, the unfired ceramic sheet forming these dielectric layers does not peel.

Figure 2B:
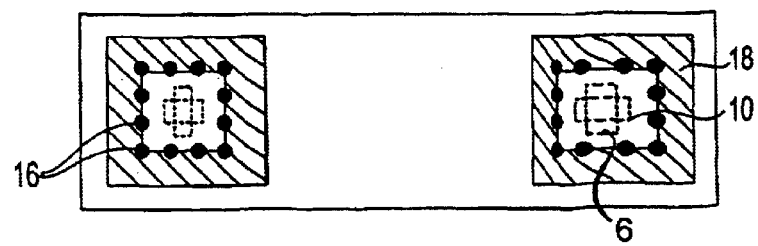
FIG. 2b is a bottom view illustrating major portions of the waveguide connection portion of the wiring board of FIG. 2a, and FIGS. 2c and 2d are side sectional views illustrating structures for connecting the wiring board of FIG. 2a to the waveguide.
Figure 2C:
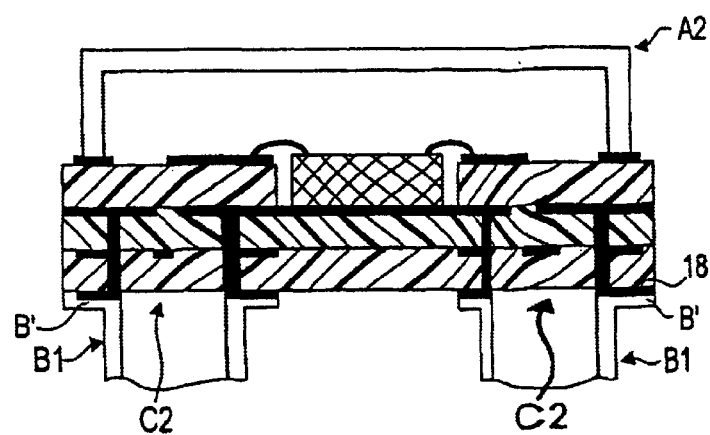
Figure 2D:
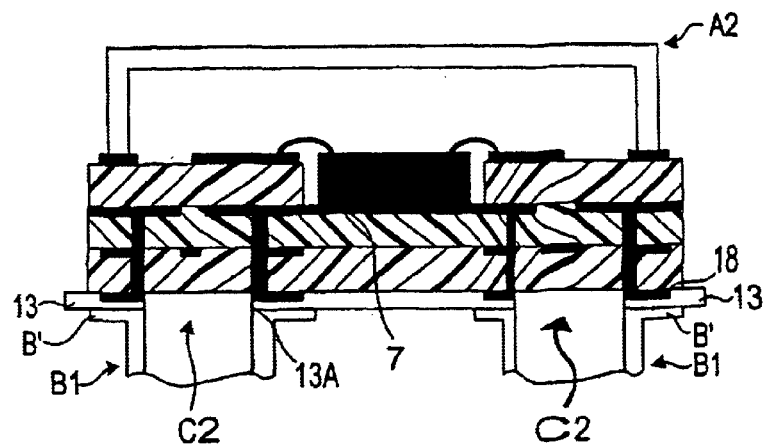

According to the above-mentioned high-frequency package A2 of the present invention, the waveguide B1 can also be connected via a connection member 13 having an opening surface 13a as shown in FIG. 2d. That is, the connection member 13 is mounted on the conductor layer 18 on the surface of the second dielectric layer 15 by using an electrically conducting adhesive such as a brazing material, and the flange B' of the waveguide B1 is connected to the connection member 13 using an electrically conducting adhesive agent or a screw, in order to firmly join the high-frequency package A2 and the waveguide B1 together and to enhance the reliability of connection between the two. In this case, the connection member 13 may be formed of a conductor such as a metal or an insulator such as ceramics or an organic resin. When the connection member 13 made of an insulator is used, it is desired to form a conductor layer on the opening surface 13a of the connection member 13 to maintain electric connection between the waveguide B1 and the grounded layer 7.

The structure of the wiring board of the present invention was described above by way of a package mounting a semiconductor device which was air-tightly sealed with a closure with reference to FIGS. 1a and 2a. The invention can similarly be applied even to a circuit substrate for mounting a package holding semiconductor devices and to a circuit substrate for directly mounting semiconductor devices. In the present invention, further, the connection characteristics to the waveguide vary depending upon the shapes of the slot 6 formed in the grounded layer 7 and of the patch conductor 10. It is therefore desired to determine a predetermined relationship for them.

FIG. 3 is a plan view illustrating a positional relationship among the slot 6, patch conductor 10 and signal transmission line 5 in the high-frequency packages of FIGS. 1a and 2a. Referring to FIG. 3, it is desired that the length SL (maximum length in a direction at right angles with the signal transmission line 5) of the slot 6 formed in the grounded layer 7 is set to be 1 to 2 times and, particularly, 10/8 to 14/8 times as great as the wave length λ of signals propagating through the dielectric substrate 1. That is, upon setting the length SL of the slot 6 to lie within the above-mentioned range, the patch conductor 10 does not work as an antenna or a dipole for exciting the signals but works to adjust the electromagnetic field distribution by dividing the signals excited through the slot 6, do that the electromagnetic field distribution becomes continuous from the slot 6 to the waveguide B1. Compared to when the patch conductor 10 is used for exciting the signals, therefore, the band for propagating the signals is widened and dispersion in the frequency of the transmitted signals decreases. When the maximum length SL of the slot 6 is smaller than the wave length λ of the signals, the patch conductor 10 can be used for exciting the signals (can be used as a dipole antenna) causing, however, such a problem that the band for transmitting the signals becomes narrow.

As described above, the patch conductor 10 does not work for exciting the signals but works for adjusting the distribution by dividing the electromagnetic waves, making it possible to eliminate dependence of the frequency of transmission signals upon the length of the patch conductor 10 and, hence, to realize a wide band and decreased dispersion.

According to the present invention, the patch conductor 10 has nearly a rectangular shape as shown in FIG. 3. Here, when a maximum length of the patch conductor 10 is denoted by W1 in a direction at right angles with the direction of the signal transmission line 5 and a maximum length thereof by L1 in a direction in parallel with the signal transmission line 5, it is desired that L1≧W1. It is further desired that the length L1 of the patch conductor 10 satisfies the conditions represented by the following formula with respect to the wave length λ of the signals, $$10\lambda/64 \leq L1 \leq 31\lambda/64$$

or $$33\lambda/64 \leq L1 \leq 63\lambda/64.$$

When the above conditions are satisfied, radiation of undesired electromagnetic waves from the patch conductor 10 is suppressed, and continuous electromagnetic field distribution is effectively maintained.

In the above-mentioned embodiment, there is no particular limitation on the thickness of the first dielectric portion (thickness of the first dielectric block 9 or thickness of the first dielectric layer 14) or on the thickness of the second dielectric portion (thickness of the second dielectric block or thickness of the second dielectric layer 15). In order to bring the electromagnetic waves emitted from the slot 6 into match with the electromagnetic field distribution in the waveguide, however, it is desired that the total thickness of the first dielectric portion and of the second dielectric portion is not smaller than ⅛ the wave length λ of the signals and, further, that the thickness of the first dielectric portion is not smaller than 1/16 the wave length λ and the thickness of the second dielectric portion is not smaller than 1/16 the wave length λ. When the second dielectric portion is not formed (the patch conductor 10 is exposured) or the thickness of the second dielectric portion is extremely thinner than that of the first dielectric portion, the patch conductor 10 is one-sided in the connection portion whereby the electromagnetic field is not continuous smoothly from the slot to the waveguide and reflection tends to increase.

The above-mentioned wiring boards of the present invention are not limited to those structures shown in FIGS. 1a and 2a, but can be modified in a variety of ways, such as forming a resonance conductor portion in the dielectric substrate 1, providing the waveguide connection portion with a third dielectric portion, or suitably changing the shape of the waveguide connection portion.

FIGS. 4a, 4b, 4c, 4d and 4e illustrate an example of the dielectric substrate 1 of high-frequency packages of FIGS. 1a and 2a equipped with resonance conductor portions.

Figure 4A:
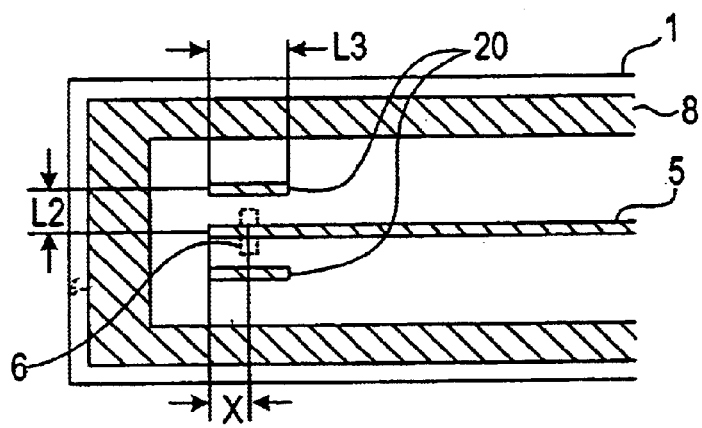
FIGS. 4a, 4b, 4c, 4d and 4e are plan views and side sectional views illustrating a major portion of the dielectric substrate on which a resonance conductor is formed.

Referring to FIG. 4a which is a plan view of the surface of the dielectric substrate, two resonance conductor portions 20 are provided on the surface of the dielectric substrate 1 near the end of the signal transmission line 5 on the grounded layer 7 (not on the slot 6). The two resonance conductor portions 20 are arranged at positions symmetrical with respect to the signal transmission line 5. In the wiring board provided with the resonance conductor portions 20, signals of the signal transmission line 5 connected to the high-frequency device (not shown in FIG. 4a) are electromagnetically coupled through the slot 6 formed in the grounded layer 7 while resonating with the resonance conductor portions 20, and are transmitted to the waveguide through the waveguide connection portion of a structure shown in FIG. 1a or 2a. According to the structure shown in FIG. 4a, the resonance conductor portions 20 suppress the upward radiation of the electromagnetic waves from the signal transmission line 5, and undergo resonance with the signals from the signal transmission line 5, enabling the signals to be transmitted to the waveguide permitting a small loss.

When the signals have a wave length λ, it is desired that the resonance conductor portions 20 have a minimum distance (shortest distance) L2 to the signal transmission line 5 of not larger than 2λ, and have a maximum length L3 which is from λ/8 to 7λ/8 and, particularly, from λ/4 to 3λ/4 in the direction in parallel with the signal transmission line 5. As far as these conditions are satisfied by the resonance conductor portions 20, undesired radiation of electromagnetic waves from the resonance conductor portions 20 is effectively suppressed, resonance with the signal transmission line 5 increases, and loss of signal transmission decreases most effectively.

Figure 4B:
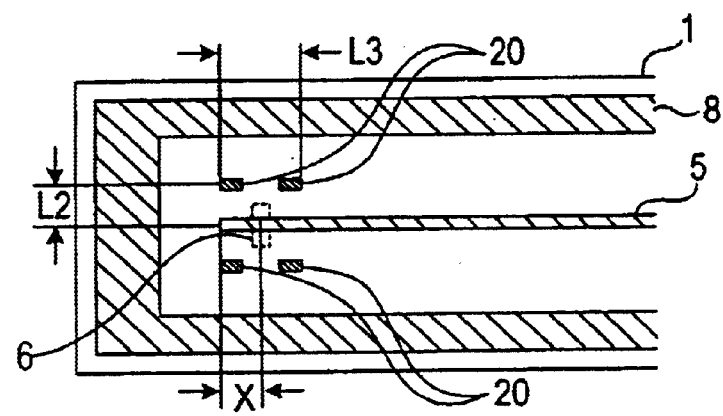
Figure 4C:
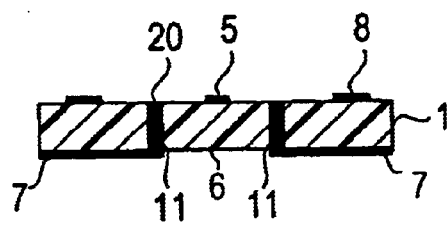

FIGS. 4b, 4c, 4d and 4e illustrate other arrangements of the resonance conductor portions 20. The resonance conductor portions 20 may be intermittently formed maintaining a gap of one-eighth the wave length λ of the signals as shown in, for example, in a plan view of FIG. 4b, or the resonance conductor portions 20 may be electrically connected to the grounded layer 7 through vertical conductors 11 as shown in a side sectional view of FIG. 4c. In the examples of FIGS. 4a, 4b and 4c, further, the resonance conductor portions 20 are formed in flush with the signal transmission line 5. However, the resonance conductor portions 20 may be formed inside the dielectric substrate 1 as shown in a side sectional view of FIG. 4d as far as they are located on the upper side of the grounded layer 7. In this case, too, it is desired that the shortest distance L2 from the resonance conductor portions 20 to the signal transmission line 5 is not larger than two times the wave length, λ of the signals.

As described above, further, it is most desired that the plural resonance conductor portions 20 are arranged to be symmetrical with respect to the signal transmission line 5. As far as there takes place resonance, however, they need not necessarily to symmetrically arranged or need not be arranged in parallel with the signal transmission line 5, either. As shown in a side sectional view of FIG. 4e, further, only one resonance conductor portion 20 may be formed on one side of the signal transmission line 5, or plural resonance conductor portions may be formed on one side of the signal transmission line 5. Or, plural resonance conductor portions 20 may be formed on both sides of the signal transmission line 5.

Figure 5:
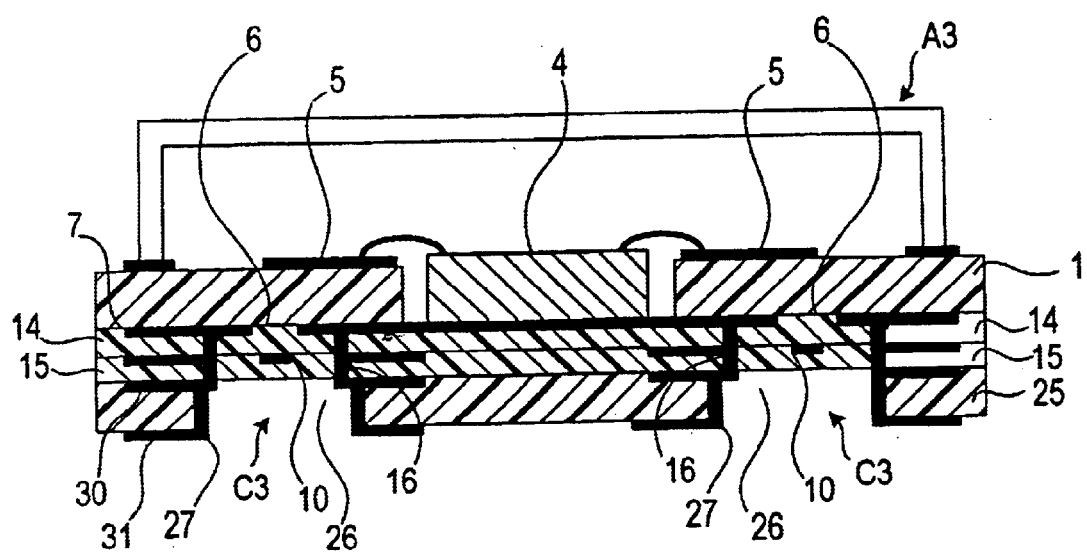
FIG. 5 is a side sectional view illustrating another wiring substrate of the present invention equipped with the layer-type waveguide connection portion.

A side sectional view of FIG. 5 illustrates a further embodiment of the wiring board (high-frequency package) of the present invention equipped with the layer-type waveguide connection portion. In a high-frequency package A3 of FIG. 5, a third dielectric layer 25 is formed on the second dielectric layer 15 making a difference from the high-frequency package A2 of FIG. 2a. That is, in FIG. 5, the third dielectric layer 25 is provided with a cavity 26 in a portion corresponding to the dielectric region (designated at C3 in FIG. 5) surrounded by the vertical conductors 16 that penetrate through the first dielectric layer 14 and the second dielectric layer 15. The flange (not shown in FIG. 5) of the waveguide is connected directly or via a connection member to the third dielectric layer 15 surrounding the cavity 26 in a manner same as that shown in FIGS. 2c and 2d. To maintain the potential of the conductor wall of the waveguide to be equal to the potential of the grounded layer 7, a conductor layer 27 is formed on the inside of the cavity 26. In order to maintain reliable electric connection between the conductor layer 27 and the vertical conductors 16, and between the conductor layer 27 and the waveguide flange, it is desired to provide a conductor band 30 in the interface between the third dielectric layer 25 and the second dielectric layer 15 surrounding the cavity 26, and to provide a conductor band 31 on the surface of the third dielectric layer surrounding the cavity 26.

In the high-frequency package A3 of FIG. 5, the signals from the signal transmission line 5 pass, due to electromagnetic coupling, through the slot 6 and dielectric region C3, propagate from the surface of the dielectric region C3 and are continuously connected to the waveguide passing through the cavity 26 in the third dielectric layer 25. The conversion loss from the signal transmission line 5 through up to the waveguide is not decreased to a sufficient degree if the center of the waveguide that is connected is deviated from the center of the slot 6. In this case, the transmission characteristics may often be dispersed. By providing the third dielectric layer 25 as shown in FIG. 5, however, the deviation in position can be effectively reduced between the center of the waveguide and the center of the slot 6, making it possible to greatly decrease the conversion loss and to prevent dispersion in the transmission characteristics. In the embodiment of FIG. 5, therefore, there is no particular limitation on the thickness of the third dielectric layer 25. From the standpoint of greatly decreasing the conversion loss, however, it is desired that the thickness of the third dielectric layer 25 is not smaller than 2.5%, preferably, not smaller than 3% and, most preferably, not smaller than 4% of the wave length λ of the signals.

In the high-frequency package A3 of FIG. 5, further, the thickness of the package as a whole becomes large due to the formation of the third dielectric layer 25 giving an advantage of an increased strength of the package. Further, the third dielectric layer 25 need not be of a single layer but may consist of plural layers, and multi-layer circuits. may be formed in the first to third dielectric layers, as a matter of course.

In the high-frequency package A2 shown in FIGS. 2a and 2b, the outer shape of the region surrounded by the vertical conductors 16, i.e., the outer shape of the waveguide connection portion C2, has the same size as the opening in cross section of the waveguide B1 that is connected to the package A2. As shown in a side sectional view of FIG. 6a, however, the outer shape of the waveguide connection portion C2 may be selected to be smaller than the cross section of opening of the waveguide B1. As described above, when the center of the waveguide is deviated from the center of the slot 6, the conversion loss from the signal transmission line 5 to the waveguide is not decreased to a sufficient degree, and the transmission characteristics will be dispersed, too. By decreasing the outer shape of the waveguide connection portion C2 as shown in FIG. 6a, the deviation in position can be effectively decreased between the center of the waveguide B1 and the center of the slot 6, whereby the conversion loss greatly decreases and dispersion in the transmission characteristics is effectively prevented.

Figure 6A:
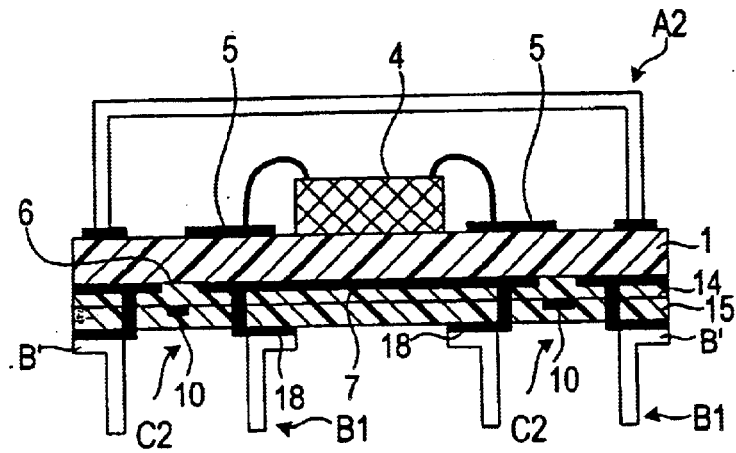
FIGS. 6a, 6b and 6c are diagrams illustrating a further wiring board of the present invention equipped with the layer-type waveguide connection portion.
Figure 6B:
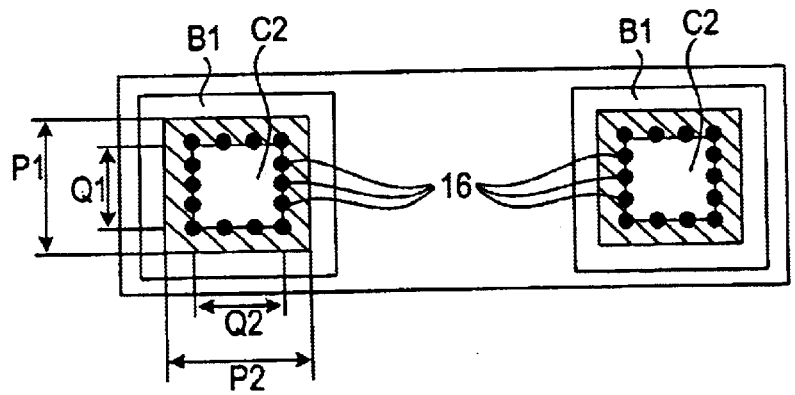

In FIG. 6a, when the opening of the waveguide B1 has a rectangular shape in cross section, it is desired that the waveguide connection portion C2 has a rectangular outer shape smaller than the opening in cross section of the waveguide B1 as shown in a sectional plan view of FIG. 6b.

In FIG. 6b, for example, when the sides of the opening of the waveguide B1 of a rectangular shape in cross section are denoted by p1 (long side) mm and p2 (short side) mm, and the sides of the rectangular waveguide connection portion C2 at a position corresponding to the sides $p^1$, $p^2$, are denoted by $Q^1$ (long side) mm and $Q^2$ (short side) mm, then, there hold relations $p^1 > Q^1$ and $p^2 > Q^2$, as a matter of course. From the standpoint of greatly decreasing the conversion loss and preventing dispersion in the transmission characteristics, however, it is desired that following conditions are satisfied concerning the long sides, $$P^1 \times 0.6 \leq Q^1 \leq P^1 - 0.1$$

and the following conditions are satisfied concerning the short sides, $$P^2 \times 0.6 \leq Q^2 \leq Q^2 - 0.1$$

Figure 6C:
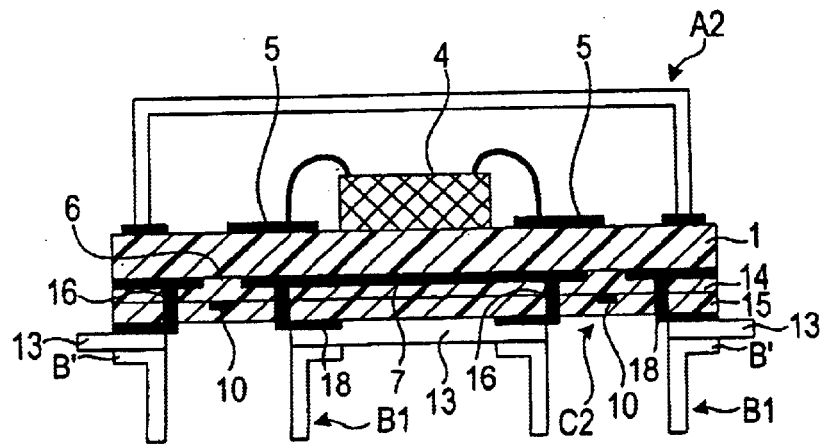

In the example of FIG. 6a like in FIG. 2c, the flange B' of the waveguide B1 is directly joined to the conductor layer 18 on the second dielectric layer 15. As shown-in FIG. 6c and FIG. 5, however, the flange B' of the waveguide B1 may be joined via the connection member 13 as shown in FIG. 6c or the third dielectric layer 25 as shown in FIG. 5. In these cases, it is desired that the sizes of the opening 13a of the connection member 13 and of the cavity 26 of the third dielectric layer 25 are brought into agreement with the opening of the waveguide B1.

In the present invention described above, the dielectric members used for forming the dielectric substrate 1, various dielectric layers and dielectric blocks, may be known ceramics, organic resins or composite materials thereof. As the ceramics, for example, there can be used ceramic materials such as $Al_2O_3$, AlN or $Si_3N_4$, or a glass material, or a glass ceramic material which is a composite material of the glass and an inorganic filler such as $Al_2O_3$, $SiO_3$ or MgO. By using these starting powders, ceramic green sheets of the forms of a substrate and a layer having a predetermined shape are molded and are fired to obtain a dielectric substrate, various dielectric layers and dielectric blocks.

Further, the transmission lines for transmitting signals and the grounded layers can be formed by using a high-melting metal such as tungsten or molybdenum or by using a low-resistance metal such as gold, silver or copper. These materials may be suitably selected depending upon the dielectric material that is used and can be integrally formed relying upon the existing lamination technology.

For example, when the dielectric substrate is formed by using such a ceramic material as $Al_2O_3$, AlN or $Si_3N_4$, a high-melting metal such as tungsten or molybdenum is printed onto the unfired molded article which is then fired at a temperature of from 1500 to 1900 DC in order to form the grounded layer, signal transmission line and various conductor layers. When the dielectric substrate is formed by using a glass material or a glass ceramic material, then, copper, gold or silver printed thereon is similarly fired at 800 to 1100° C. to form the grounded layer. When the dielectric substrate is formed by using an insulating material which contains an organic resin, then, a paste containing copper, gold or silver is applied, or a metal foil is adhered to form the lines and the grounded layer.

EXPERIMENTS

The invention will now be described by way of the following experiments.

(Experiment 1)

A high-frequency package of the structure shown in FIGS. 1a and 1b was prepared by using $Al_2O_3$ having a dielectric constant of 9.0 as a dielectric material and by using tungsten as an electrically conducting material.

Figure 7:
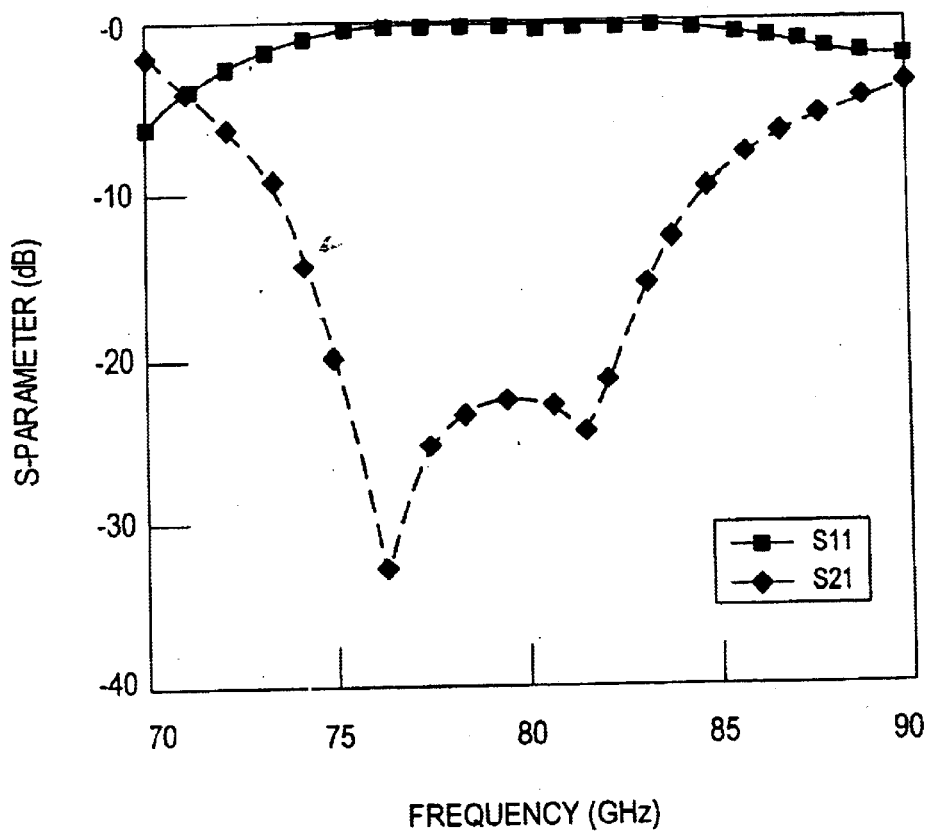
FIG. 7 is a diagram illustrating transmission characteristics including S21 (loss) of zero dB and S11 (reflected at −25 dB at 77 GHz of a high-frequency package A1 of FIG. 1b is connected to a waveguide B1 of FIG. 1b.

Thickness of the dielectric substrate 1: 0.15 mm
Thickness of the first dielectric block 9: 0.2 mm
Thickness of the second dielectric block 11: 0.2 mm Transmission characteristics of the connection between the high-frequency package and the waveguide were evaluated by a finite element method. The results were as shown in FIG. 7.

coplanar was transformed into the microstrip line, and was transformed into the waveguide which was then connected to the network analyzer to take measurements.

The samples of the wiring boards were prepared in a number of five each. The five samples were evaluated for their average loss S21 value, best values, worst values, and differences between the best values and the worst values as dispersion. The results were as shown in Table 1. Table 1 also shows an average band (frequency band width in which the loss S21 was not smaller than −2.0 dB).

Table 1 shows relations between the parameters and the wave length λ presuming that the wave length of signals of 94 GHz is 1.064 mm in $Al_2O_3$ (dielectric constant 9.0).

TABLE 1

| Sample No. | Length of Slot | | Conductor | | | S21 (dB) | | | | |
|---|---|---|---|---|---|---|---|---|---|---|
| | Length SL (mm) | Ratio to the wave length | Length L1 (mm) | Ratio to the wave length | Width W1 (mm) | Average | Best | Worst | Dispersion | Band |
| *1 | 0.93 | 7/8 | 0.53 | 1/2 | 0.63 | 1.81 | 1.55 | 1.93 | 0.38 | 8 |
| *2 | 2.26 | 17/8 | 0.53 | 1/2 | 0.63 | 1.8 | 1.53 | 1.97 | 0.44 | 8 |
| 3 | 1.06 | 1 | 0.53 | 1/2 | 0.63 | 1.72 | 1.54 | 1.84 | 0.3 | 10 |
| 4 | 1.33 | 10/8 | 0.53 | 1/2 | 0.63 | 1.67 | 1.48 | 1.78 | 0.3 | 10 |
| 5 | 1.86 | 14/8 | 0.53 | 1/2 | 0.63 | 1.66 | 1.49 | 1.78 | 0.29 | 10 |
| 6 | 2.13 | 2 | 0.53 | 1/2 | 0.63 | 1.73 | 1.53 | 1.83 | 0.3 | 10 |
| 7 | 1.2 | 10/8 | 0.53 | 1/2 | 0.53 | 1.57 | 1.42 | 1.71 | 0.29 | 11 |
| 8 | 1.2 | 10/8 | 0.53 | 1/2 | 0.1 | 1.56 | 1.41 | 1.7 | 0.29 | 11 |
| 9 | 1.2 | 10/8 | 0.15 | 9/64 | 0.1 | 1.55 | 1.4 | 1.69 | 0.29 | 11 |
| 10 | 1.2 | 10/8 | 0.17 | 10/64 | 0.1 | 1.49 | 1.36 | 1.62 | 0.26 | 13 |
| 11 | 1.2 | 10/8 | 0.515 | 31/64 | 0.1 | 1.52 | 1.39 | 1.65 | 0.26 | 13 |
| 12 | 1.2 | 10/8 | 0.55 | 33/64 | 0.1 | 1.52 | 1.38 | 1.64 | 0.26 | 13 |
| 13 | 1.2 | 10/8 | 0.55 | 63/64 | 0.1 | 1.5 | 1.36 | 1.62 | 0.26 | 13 |
| 14 | 1.2 | 10/8 | 1.06 | 1 | 0.1 | 1.56 | 1.41 | 1.69 | 0.28 | 12 |
| *15 | 0.66 | 5/8 | — | — | — | 1.9 | 2.3 | 1.5 | 0.8 | 0 |

Sample marked with * are those of Reference Examples.

It will be understood from FIG. 7 that the package and the waveguide have been connected together maintaining such favorable transmission characteristics as S21 (loss) of zero dB and S11 (reflection) of −25 dB at 77 GHz.

(Experiment 2)

Figure 8:
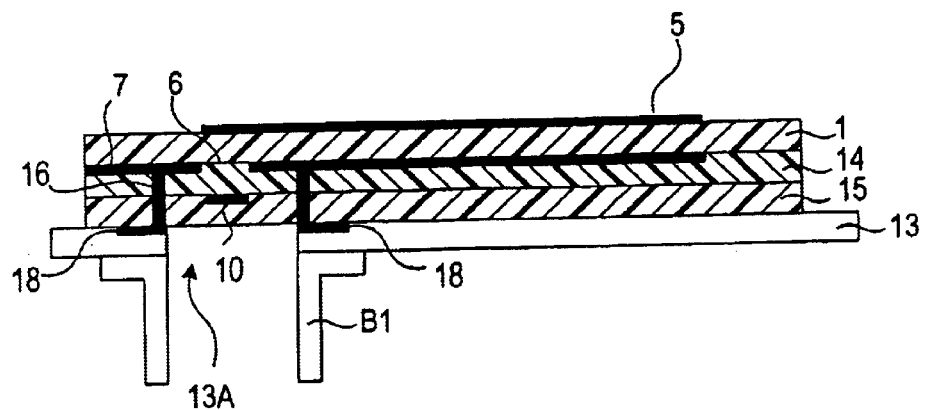
FIG. 8 is a view illustrating the structure of a wiring board fabricated according to one embodiment of the present invention.

A wiring board of a structure shown in FIG. 8 designed to exhibit an object frequency of 94 GHz was prepared by the simultaneous firing by using $Al_2O_3$ having a dielectric constant of 9.0 as a dielectric material and by using tungsten as an electrically conducting material. Gold was plated maintaining a thickness of 3 μm on the surface of the exposed conductor layer.

The thus prepared wiring boards having various lengths SL of the slot 6, various lengths L1 of the conductor 10 and various widths W1 were evaluated for their connection characteristics between the waveguide and the signal transmission line.

The waveguide B1 was connected by fastening the flange of the waveguide, by using a screw, to the connection member 13 provided under the conductor layer.

The connection characteristics were measured by using a network analyzer. That is, a probe (coplanar line structure) from the network analyzer was brought into contact with the coplanar line formed on the wiring board of a sample, the From Table 1, in the case of the sample No.1 having the length SL of slot of ⅞λ, the loss S21 (average) was 1.81 dB and in the case of the sample No.2 having SL of 17/8λ, the loss S21 (average) was 1.8 dB.

In the case of the samples Nos. 3 to 14 having SL of not smaller than 1λ but not larger than 2λ, the losses S21 (average) were smaller than 1.8 dB, the bands were not smaller than 10 GHz and the dispersion was not larger than 0.3 dB, thus exhibiting favorable results.

Among them, the samples Nos. 7 to 9 and to 14 in which L1 and W1 of the patch conductor 10 were L1>W1, and the samples Nos. 10 to 13 in which L1 was 10λ/64 to 31λ/64 or 33λ/64 to 63λ/64, exhibited the losses S21 (average) of not larger than 1.6 dB and bands of not smaller than 11 GHz, offering further superior properties.

(Experiment 3)

The high-frequency package of FIG. 2a forming the resonance conductor portion of the structure shown in FIGS. 4a to 4e was prepared in the same manner as in Experiment 2, and the transmission characteristics of the connection to the waveguide were evaluated based upon the finite element method. The results were as shown in Table 2.

In Table 2, S21 represents transmission losses of signals from the signal transmission line 5 to the waveguide when the frequency is 68 GHz.

In all packages, the real dielectric constant $\epsilon_1$ of the surface of the dielectric substrate 1 to the line 5 was presumed to be 6.0 and the wave length $\lambda$ of signals was presumed to be 1.8 mm from the following formula, $$\lambda_o/(\epsilon_1)^{1/2}=0.408\times\lambda_o$$

When the resonance conductor portions were formed inside the dielectric substrate 1 (FIG. 4d), the wave length $\lambda$ of signal was presumed to be 1.47 mm from the following formula, $$\lambda_o/(\epsilon_2)^{1/2}=0.333\times\lambda_o$$

TABLE 2

Figure 4D:
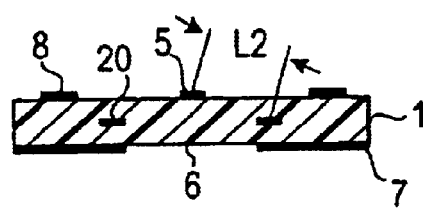
Figure 4E:
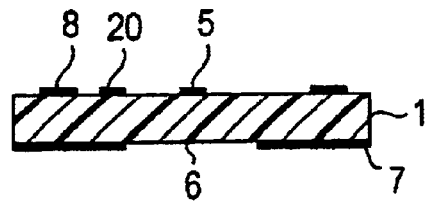

| Sample No. | Structure of resonance conductor | Resonance conductor | | | | Loss \|S1\| (dB) |
|---|---|---|---|---|---|---|
| | | Distance L2 (mm) | Relation to wave length | Length L3 (mm) | Relation to wave length | |
| *1 | FIG. 4a | without resonance conductor | | | | 1.6 |
| 2 | FIG. 4a | 4.5 | 2.5λ | 1.8 | 1.0λ | 1.1 |
| 3 | FIG. 4a | 3.6 | 2.0λ | 1.8 | 1.0λ | 0.88 |
| 4 | FIG. 4a | 1.8 | 1.0λ | 1.8 | 1.0λ | 0.83 |
| 5 | FIG. 4a | 1.8 | 1.0λ | 1.58 | 0.87λ5 | 0.78 |
| 6 | FIG. 4a | 1.8 | 1.0λ | 1.35 | 0.75v | 0.74 |
| 7 | FIG. 4a | 1.8 | 1.0λ | 0.45 | 0.25λ | 0.75 |
| 8 | FIG. 4a | 1.8 | 1.0λ | 0.23 | 0.125λ | 0.81 |
| 9 | FIG. 4b | 1.8 | 1.0λ | 1.35 | 0.75λ | 0.75 |
| 10 | FIG. 4c | 1.8 | 1.0λ | 1.35 | 0.75λ | 0.75 |
| 11 | FIG. 4d | 1.47 | 1.0λ | 1.35 | 0.75λ | 0.74 |
| 12 | FIG. 4e | 1.8 | 1.0λ | 1.35 | 0.75λ | 0.76 |

Sample marked with * are those of Reference Examples.

From Table 2, when there was no resonance conductor portion (sample No.1), the loss $|S21|$ was 1.6 dB at a signal frequency of 68 GHz. Upon providing the resonance conductor portion, however, it was learned that the loss decreased down to 1.1 dB or smaller.

When the distance L2 between the resonance conductor portion and the signal transmission line 5 was not larger than 2λ(samples Nos. 3 to 12), the losses were not larger than 0.88 dB. When the length L3 of the resonance conductor portion was λ/8 to 7λ/8 (samples Nos. 5 to 12), the losses were not larger than 0.81 dB.

(Experiment 4)

Sample substrates (object frequency of 94 GHz) of the same constitution as that of FIG. 5 were prepared in the same manner as in Experiment 2 but without providing the semiconductor device-mounting portion and connecting the signal transmission lines 5 for input and output together. The connection characteristics between the waveguide and the signal transmission line were evaluated in the same manner as in Experiment 2. The results were as shown in Table 3.

The wave length $\lambda$ of signals in the dielectric substrate was calculated presuming that the wave length of signals at 94 GHz in the air of a dielectric constant of 1.0 was 3.19 mm.

TABLE 3

| Sample No. | Thickness of 3rd dielectric layer | Ratio to signal wave length λ (%) | S21 (dB) | | | Dispersion | Remarks |
|---|---|---|---|---|---|---|---|
| | | | Average | Best | Worst | | |
| 1 | none | — | 3.71 | 3.37 | 4.05 | 0.68 | |
| 2 | 0.064 | 2 | 3.65 | 3.335 | 3.94 | 0.59 | |
| 3 | 0.080 | 2.5 | 3.60 | 3.36 | 3.84 | 0.48 | |
| 4 | 0.096 | 3 | 3.56 | 3.34 | 3.78 | 0.44 | |
| 5 | 0.128 | 4 | 3.55 | 3.35 | 3.74 | 0.39 | |
| 6 | 0.160 | 5 | 3.55 | 3.35 | 3.73 | 0.38 | |
| 7 | 0.160 | 5 | 3.54 | 3.34 | 3.72 | 0.38 | conductor inside dielectric region |

From Table 3, with the sample substrates without the third dielectric layer 25, the losses S21 dispersed greatly. With the sample substrates provided with the third dielectric layer 25, however, dispersion in the losses was decreased. By selecting the thickness of the third dielectric layer 25 to be not smaller than 2.5% of the wave length $\lambda$ of signals, further, the dispersion could be decreased to be not larger than 0.5 dB. By selecting the thickness to be not smaller than 3% of the wave length $\lambda$ of signals, further, the dispersion could be decreased to be not larger than 0.45 dB and by selecting the thickness to be not smaller than 4%, the dispersion could be further decreased to be not larger than 0.4 dB.

(Experiment 5)

Sample substrates (object frequency of 94 GHz) of the same constitution as that of FIG. 6a were prepared in the same manner as in Experiment 2 but without providing the semiconductor device-mounting portion and connecting the signal transmission lines 5 for input and output together. The connection characteristics between the waveguide and the signal transmission line were evaluated in the same manner as in Experiment 2. The results were as shown in Table 4.

The waveguide was joined to the sample substrate by fastening the flange using a screw via a connection portion of a connection member 13 (Fe—Co—Ni alloy) as shown in FIG. 2d.

After having evaluated the characteristics of the sample substrates, the thermal shock testing was conducted to evaluate the reliability. The conditions consisted of a temperature cycle testing in a liquid vessel, and the samples were held at 0° C. and at 100° C. for 5 minutes, respectively. The number of samples was 10. When any one of the sample substrates was broken, the number of cycles at that moment was counted. The testing was conducted up to 1000 cycles, and the breakage was examined by checking the appearance of the samples every after 100 cycles.

TABLE 4

| Sample No. | Q² (mm) | Ratio to short side P² of waveguide | Q¹ (mm) | Ratio to short side P¹ of waveguide | S21 (dB) Average | Best | Worst | Dispersion | Number of cycles until reliability breaks |
|---|---|---|---|---|---|---|---|---|---|
| *1 | 1.27 | 1 | 2.54 | 1 | 3.67 | 3.32 | 3.98 | 0.66 | 100 |
| 2 | 1.22 | 0.96 | 2.49 | 0.98 | 3.58 | 3.31 | 3.86 | 0.55 | 300 |
| 3 | 1.17 | 0.92 | 2.44 | 0.96 | 3.56 | 3.31 | 3.8 | 0.49 | >1000 |
| 4 | 1 | 0.79 | 2 | 0.79 | 3.52 | 3.29 | 3.75 | 0.46 | >1000 |
| 6 | 0.762 | 0.6 | 1.524 | 0.6 | 3.56 | 3.32 | 3.8 | 0.48 | >1000 |
| 7 | 0.66 | 0.52 | 1.42 | 0.56 | 3.67 | 3.43 | 3.81 | 0.48 | >1000 |

Samples marked with * are those of Reference Examples.

Table 4 shows that in the case of the sample No.1 in which the size of the dielectric region was set to be same as the opening in cross section of the waveguide, dispersion in the loss S21 was great among the substrates, and cracks have occurred in the junction interface between the ceramics and the connection member after 100 cycles.

When the size of the dielectric region was selected to be smaller than the opening in cross section of the waveguide as in the samples Nos. 2 to 6, the dispersion could be decreased, and the substrates did not break until after 300 cycles in the reliability testing.

In the samples Nos. 3, 4, 5 and 6 in which the dielectric region was further decreased, the dispersion could be further decreased, and the reliability could be maintained up to 1000 cycles in the thermal shock testing.

What is claimed is:

1. A wiring board comprising:
   a dielectric substrate;
   a signal transmission line disposed on one surface of said dielectric substrate;
   a grounded layer disposed on the other surface of said dielectric substrate; and
   a connection portion for connecting the signal transmission line to a waveguide, said connection portion being disposed on the grounded layer;
   wherein said grounded layer has a slot at a position opposed to an end of said signal transmission line; and
   wherein said connection portion includes a first dielectric layer disposed so as to cover substantially the whole surface of the grounded layer disposed on the other surface of said dielectric substrate, a second dielectric layer is laminated on the first dielectric layer, and a patch conductor provided in an interface between said first dielectric layer and said second dielectric layer, a portion of said first dielectric layer positioned on said slot provides the first dielectric portion, and a portion of said second dielectric layer positioned over said slot provides the second dielectric portion.

2. A wiring board according to claim 1, wherein a connection member is provided on said second dielectric layer to secure the electrically conducting walls of the waveguide, said connection member has an opening of a size substantially the same as the shape of an opening portion in cross section of the waveguide that is to be connected, and the inner surfaces of the opening of said connection member comprises an electric conductor.

3. A wiring board according to claim 1, wherein vertical conductors are provided penetrating through the first dielectric layer and the second dielectric layer so as to surround said patch conductor with said patch conductor at a center of said vertical conductors, said first dielectric portion and said second dielectric portion are disposed in a region surrounded by said vertical conductors, and the conductor wall of the waveguide to be connected to the connection portion is electrically connected to said grounded layer via said vertical conductors.

4. A wiring board according to claim 3, wherein the first dielectric portion and the second dielectric portion surrounded by said vertical conductors have an outer shape which is the same as, or smaller than, the shape of an opening in cross section of the waveguide that is to be connected.

5. A wiring board according claim 4, wherein a connection member is provided on said second dielectric layer to secure the electrically conducting walls of the waveguide, said connection member has an opening of a size larger than the respective outer shapes of said first and second dielectric portions but is substantially the same as the shape of the opening portion in cross section of the waveguide that is to be connected, and the inner surfaces of the opening of said connection member comprises an electric conductor.

6. A wiring board according to claim 1, wherein a maximum length SL of said slot in a direction at right angles with the signal transmission line is from 1 to 2 times as great as the wave length of signals propagating through the dielectric substrate.

7. A wiring board according to claim 6, wherein said patch conductor has a rectangular shape and, when a maximum length W1 of said patch conductor in a direction at right angles with said signal transmission line, and a maximum length L1 thereof in a direction in parallel with said signal transmission line, there holds a relationship L1>WI.

8. A wiring board according to claim 7, wherein, when the wave length of signals propagating through the dielectric substrate is denoted by $\lambda$, the length L1 satisfies the condition of the following formula, $$10\lambda/64 < L1 < 31\lambda/64$$

or $$33\lambda/64 < L1 < 63\lambda/64.$$

* * * * *